(12) United States Patent
Suvkhanov et al.

(10) Patent No.: US 7,429,749 B2
(45) Date of Patent: Sep. 30, 2008

(54) STRAINED-SILICON FOR CMOS DEVICE USING AMORPHOUS SILICON DEPOSITION OR SILICON EPITAXIAL GROWTH

(75) Inventors: Agajan Suvkhanov, Portland, OR (US); Mohammad R. Mirabedini, Redwood City, CA (US)

(73) Assignee: LSI Corporation, Milpitas, CA (US)

( * ) Notice: Subject to any disclaimer, the term of this patent is extended or adjusted under 35 U.S.C. 154(b) by 1115 days.

(21) Appl. No.: 10/455,489

(22) Filed: Jun. 4, 2003

(65) Prior Publication Data

US 2004/0247894 A1    Dec. 9, 2004

(51) Int. Cl.
    *H01L 29/04* (2006.01)
(52) U.S. Cl. .................. 257/52; 438/482; 438/486
(58) Field of Classification Search ........... 438/199, 438/285, 293, 483, 486, 516, 530, 482; 257/52
    See application file for complete search history.

(56) References Cited

U.S. PATENT DOCUMENTS

| 6,682,980 B2 * | 1/2004 | Chidambaram et al. ...... 438/302 |
| 6,703,293 B2 * | 3/2004 | Tweet et al. ................... 438/518 |
| 2004/0232422 A1 * | 11/2004 | Forbes .......................... 257/63 |

OTHER PUBLICATIONS

Nobuyuki Sugii, Digh Hisamoto, Katsuyoshi Washio, Natsuki Yokoyama, and Shin'chiro Kimura, "Enhanced Performance of Strained-Si MOSFETs on CMP SiGe Virtual Substrate," IEEE, 2001, 0-7803-7052-X/01, p. 1-4.
Paul Comita, AnnaLena Thilderkvist, and Arkadii V. Samoilov, "Applied Materials FEOL Seminar 2002," Oct. 29, 2002, p. 1-37.
K. Rim, S. Koester, M. Hargrove, J. Chu, P. M. Mooney, J. Ott, T. Kanarsky, P. Ronsheim, M.Ieong, A. Grill, and H.-S. P. Wong, "Strained Si NMOSFETs for High Performance CMOS Technology," IEEE 2001 Symposium on VLSI Technology Digest of Technical Papers, 2001, p. 59 (1-2).
Yee-Chia Yeo, Qiang Lu, Chenming Hu, Tsu-Jae King, T. Kawashima, M. Oishi, S. Mashiro, and J. Sakai, "Enhanced performance in sub-100 nm CMOSFETs using strained epitaxial silicongermanium", IEEE International Electron Device Meeting Technical Digest, pp. 753-756, San Francisco, CA, Dec. 2000, www.eecs.berkeley.edu/IPRO/Summary/01abstracts/ycyeo.1.html, p. 1-4.

* cited by examiner

*Primary Examiner*—Trung Dang
(74) *Attorney, Agent, or Firm*—L. Jon Lindsay

(57) ABSTRACT

An integrated circuit (IC) includes a strained-silicon layer formed by deposition of amorphous silicon onto either a region of a semiconductor layer that has been implanted with ions to create a larger spacing between atoms in a crystalline lattice of the semiconductor layer or a silicon-ion layer that has been epitaxially grown on the semiconductor layer to have an increased spacing between atoms in the silicon-ion layer. Alternatively, the IC includes a strained-silicon layer formed by silicon epitaxial growth onto the region of the semiconductor layer that has been implanted with ions. The IC also preferably includes a CMOS device that preferably, but not necessarily, incorporates sub-0.1 micron technology. The implanted ions may preferably be heavy ions, such as germanium ions, antimony ions or others. Ion implantation may be done with a single implantation process, as well as with multiple implantation processes.

21 Claims, 4 Drawing Sheets

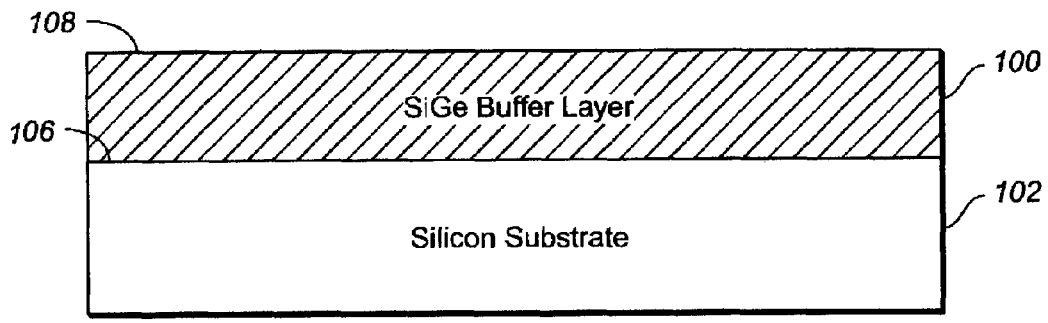
FIG._1
*(PRIOR ART)*
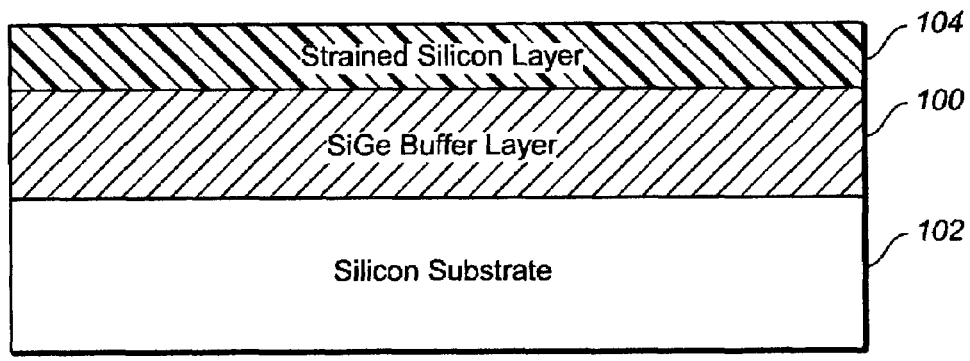
FIG._2
*(PRIOR ART)*
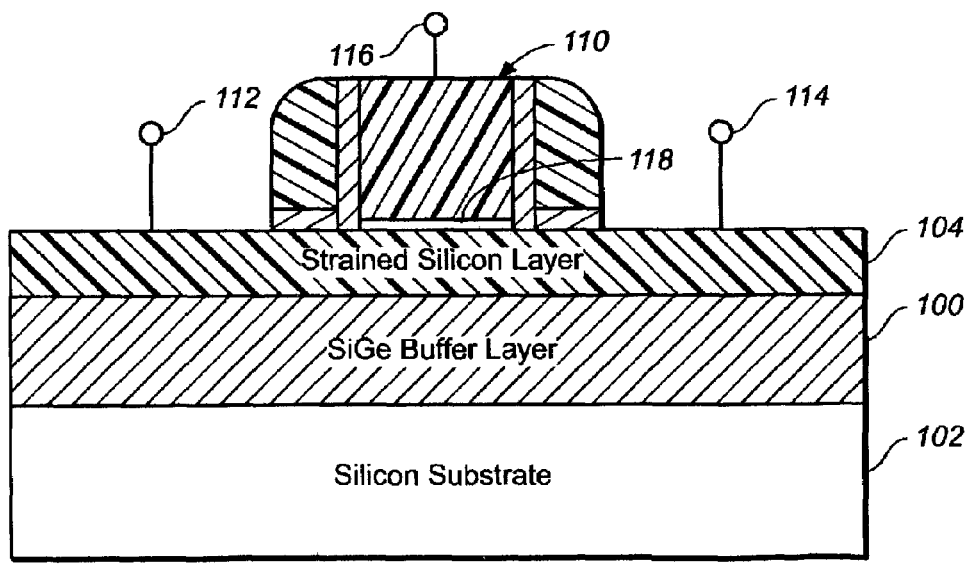
FIG._3
*(PRIOR ART)*

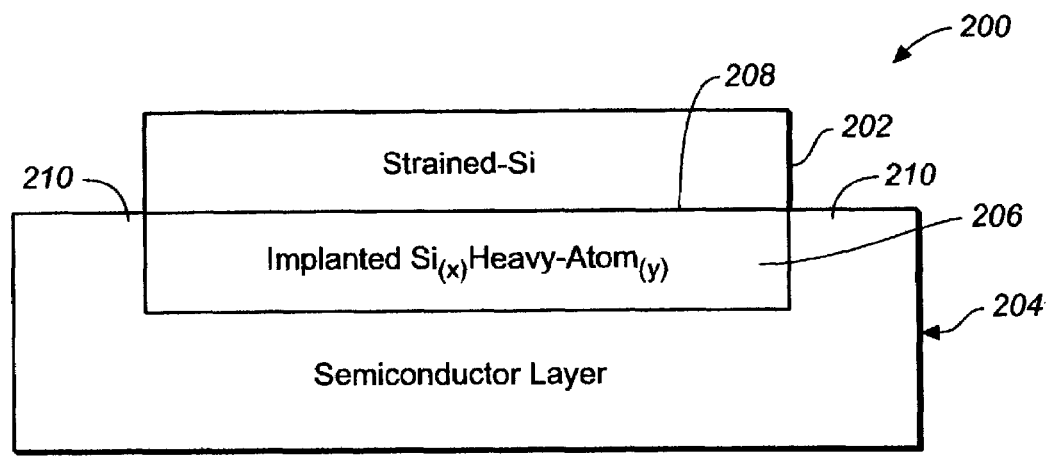
FIG._4
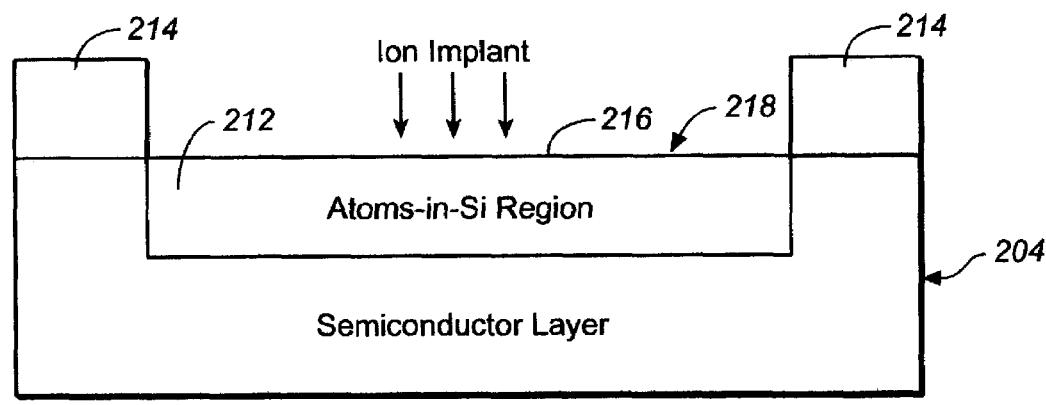
FIG._5
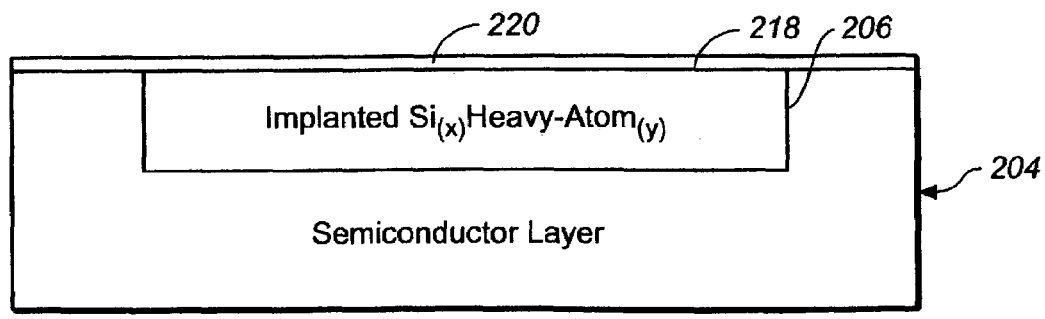
FIG._6

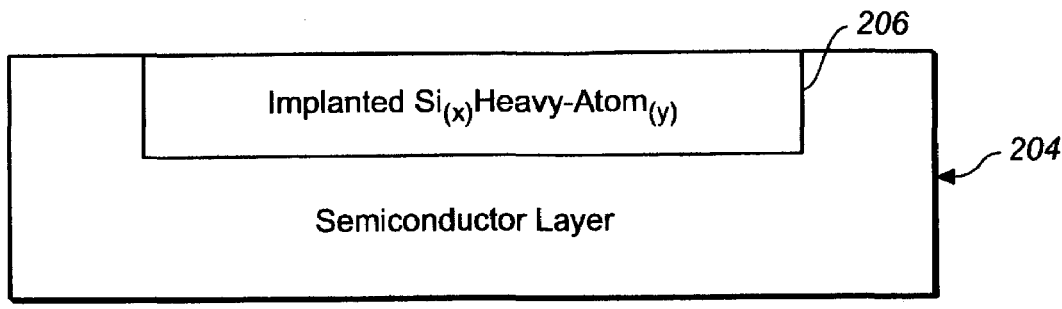
FIG._7
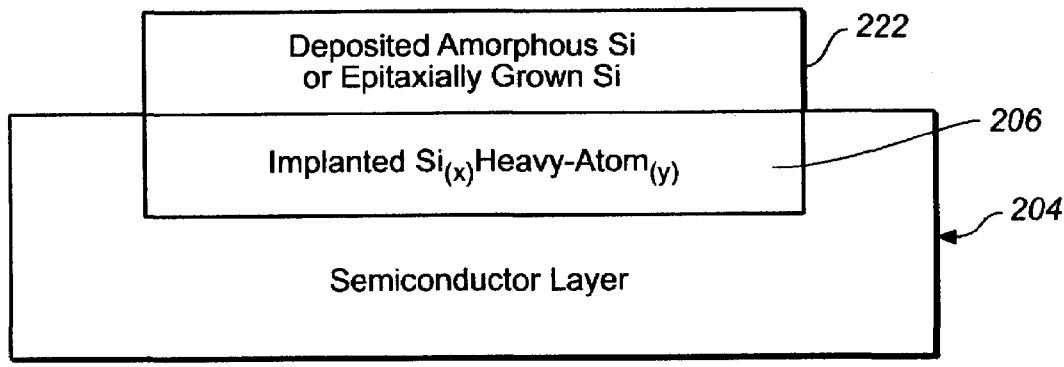
FIG._8
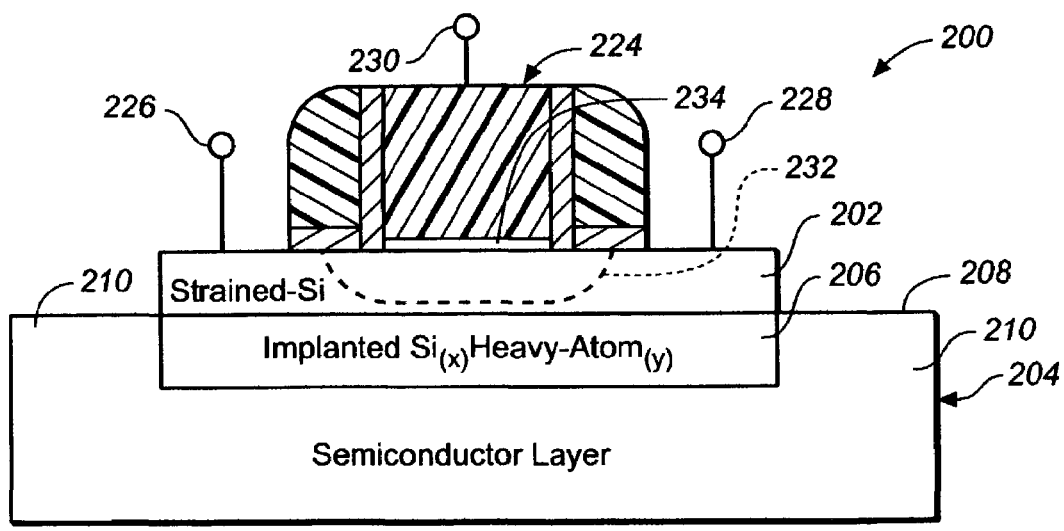
FIG._9

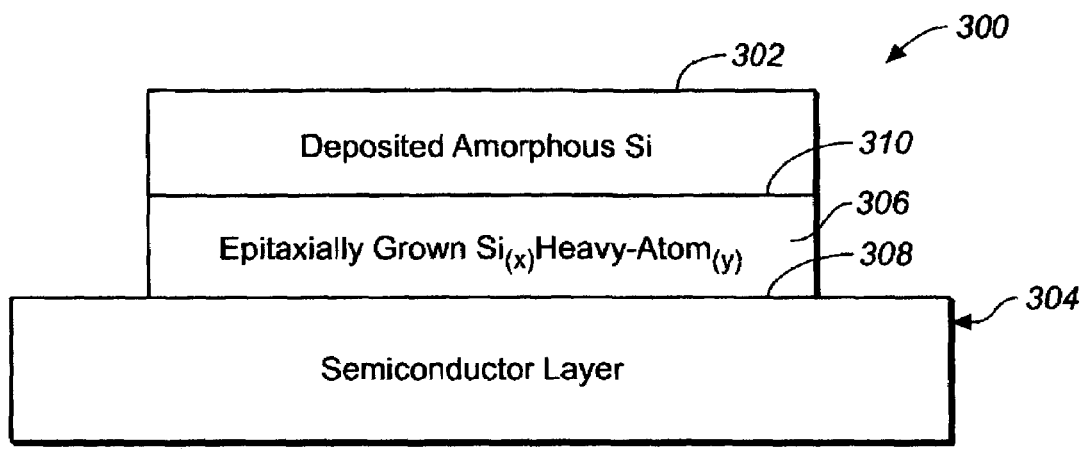
FIG._10
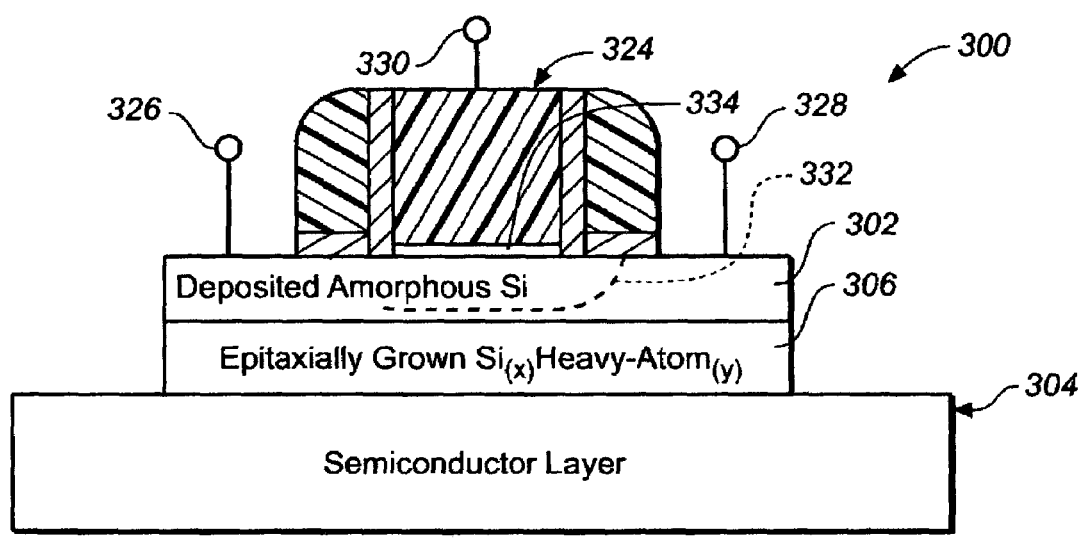
FIG._11

STRAINED-SILICON FOR CMOS DEVICE USING AMORPHOUS SILICON DEPOSITION OR SILICON EPITAXIAL GROWTH

CROSS-REFERENCE TO RELATED APPLICATIONS

This invention is related to an invention for Ion Implantation in Channel Region of CMOS Device for Enhanced Carrier Mobility, described in U.S. patent application Ser. No. 10/418,385, filed Apr. 18, 2003, and to an invention for Ion Recoil Implantation and Enhanced Carrier Mobility in CMOS Device, described in U.S. patent application Ser. No. 10/418,375, filed Apr. 18, 2003, both invented by the present inventors, and assigned to the assignee of the present invention. The subject matter of these applications is incorporated herein by this reference.

FIELD OF THE INVENTION

This invention relates to semiconductor integrated circuits (ICs) having strained-silicon (strained-Si) formed therein. In particular, this invention relates to new and improved techniques for forming a strained-silicon layer, preferably for incorporating with a CMOS (complimentary metal-oxide semiconductor) device within the IC.

BACKGROUND OF THE INVENTION

A significant trend throughout IC development has been to reduce the size of the components of the IC's. As the size is reduced, the performance requirements of the materials of the components become more stringent. For CMOS devices (e.g. CMOS transistors) in particular, increased performance requirements have generally been met by aggressively scaling the thickness and/or dielectrical properties of the gate dielectric and the length of the channel of the transistors. As attempts have been made to scale down CMOS technology into the sub-0.1 micron dimensions, however, the performance requirements for the CMOS devices have proven so stringent that the technique of scaling either the gate dielectric or the channel length or both has been a very difficult and/or impractical solution for meeting the high performance requirements.

To meet the increased performance requirements of the smaller CMOS devices, it has been suggested to alter characteristics other than the gate dielectric and/or channel length of the devices. One such characteristic for which improvements have been suggested is the mobility of the carriers in the channel region. For example, strained-Silicon ("strained-Si" or "SSI") may be incorporated into the channel region, since strained-Si is known to have greater carrier mobility characteristics than do the materials that have been more commonly used in the channel region of CMOS devices. (K. Rim, S. Koester, M. Hargrove, J. Chu, P. M. Mooney, J. Ott, T. Kanarsky, P. Ronsheim, M. leong, A. Grill, and H.-S. P. Wong, "Strained-Si NMOSFETs for High Performance CMOS Technology," 2001 Symposium on VLSI Technology Digest of Technical Papers, 2001, p. 59.)

Formation of a strained-Si layer on a semiconductor wafer has been done in a variety of ways. One technique involves complex fabrication processes, which includes epitaxial growth steps, such as epitaxial growth of a relatively thick, graded silicon-germanium (SiGe) film 100 onto a silicon substrate 102 followed by epitaxial growth of a strained-Si layer 104 onto the SiGe film 100, as shown in FIGS. 1, 2 and 3. The strain in the strained-Si layer 104 is induced by the underlying SiGe film 100. The SiGe film 100 is typically formed with a graded concentration of Ge in the Si, wherein the concentration of the Ge is slowly increased as the SiGe film 100 is grown on the substrate 102. In order to produce high quality strained-Si it is essential to carefully control the stoichiometry of the layer during the SiGe epitaxial growth process. Thus, the introduction of the gases into the epitaxial growth reactor chamber (not shown) must be carefully varied during fabrication of the SiGe film 100. In this manner, the spacing between the atoms in the crystalline structure of the SiGe film 100 is slowly increased from the beginning 106 to the surface 108 of the SiGe film 100. When the Si layer 104 is epitaxially grown on top of the SiGe film 100 (FIG. 2), the increased spacing is effectively maintained between the Si atoms, which leads to a straining of the Si layer 104. A conventional CMOS transistor 110 (FIG. 3), having conventional source, drain and gate electrodes 112, 114 and 116 and a conventional gate oxide region 118, is then fabricated on top of the strained-Si layer 104. The increased spacing between the Si atoms in the strained-Si layer 104 enhances the mobility of the carriers in the channel region, which is formed in the strained-Si layer 104 under the gate oxide 118 and between the source and drain 112 and 114.

The epitaxial growth steps, particularly for the SiGe epitaxial growth procedure, increase the time and cost of fabrication required to form the IC. Thus, there is a tradeoff between the performance characteristics and the cost of the resulting IC. Additionally, the presence of the strained-Si layer 104 sets limitations on the temperatures at which any subsequent processing steps may be performed, thereby limiting the flexibility with which the subsequent processing steps may be performed. Furthermore, the relatively thick SiGe film 100 acts as a thermal insulation layer, so the CMOS transistors formed thereon are susceptible to self-heating during operation of the IC, thereby degrading the performance capability of the IC. Also, isolation of the CMOS transistor 110, typically with shallow trench isolation, must be defined in both the strained-Si layer 104 and the SiGe film 100 as well as in the silicon substrate 102, which adds to the complexity of the overall IC fabrication. Furthermore, this technique is prone to defects, which may occur in the SiGe film 100 and, thus, propagate into the strained-Si layer 104 and higher layers of materials. Such defects may involve threading dislocations in the crystalline structure of the various layers. The threading dislocations negatively impact carrier mobility, gate oxide quality and overall device performance.

It is with respect to these and other considerations that the present invention has evolved.

SUMMARY OF THE INVENTION

The present invention involves an IC and a method of making an IC having a strained-Si layer therein, and preferably in a situation in which a CMOS device is formed on the strained-Si layer. In one embodiment, the strained-Si layer is formed by amorphous Si deposition on a layer of material comprising Si and a "heavy" atom, such as germanium (Ge) or antimony (Sb), i.e. $Si_{(x)}Heavy\text{-}Atom_{(y)}$. In another embodiment, the strained-Si layer is formed by Si epitaxial growth on an ion-implanted $Si_{(x)}Heavy\text{-}Atom_{(y)}$ layer.

Epitaxial growth procedures require the use of a relatively expensive reactor chamber in which the epitaxial growth occurs. The procedure described in the background can require at least two such reactor chambers or one reactor chamber used for an extra long time. With two such reactor chambers, one reactor chamber is used for the SiGe epitaxial growth and one is used for the Si epitaxial growth. With one such reactor chamber, the chamber must be used for an extra long time to perform both epitaxial growths. Also, since the SiGe epitaxial growth typically results in a rough surface, the wafer may have to be removed for polishing and then returned to the chamber for the Si epitaxial growth. Furthermore, since the combined epitaxial growth procedures take a significantly long time, it may be necessary to add more reactor chambers in parallel in the fabrication line, so that the epitaxial growth procedure can be performed on more than one wafer at a time. In fact, since the SiGe epitaxial growth procedure is relatively long by itself, even if the two epitaxial growth procedures are performed in different reactor chambers, it may still be necessary to add reactor chambers to perform the SiGe epitaxial growth procedure on more than one wafer in parallel. In other words, a considerable amount of time and/or cost is required to perform the procedure described in the background. The present invention, on the other hand, preferably requires one epitaxial growth procedure or none, thereby reducing the cost of the over-all processing.

The amorphous Si deposition embodiment does not require the more expensive epitaxial growth process to create the strained-Si layer. Additionally, the formation of the $Si_{(x)}$Heavy-Atom$_{(y)}$ layer is preferably done either by epitaxial growth of the $Si_{(x)}$Heavy-Atom$_{(y)}$ layer or by implantation of the ion into a Si layer. Thus, the amorphous Si deposition embodiment preferably uses one epitaxial growth procedure or none for this portion of the over-all fabrication of the IC.

The Si epitaxial growth embodiment preferably forms the $Si_{(x)}$Heavy-Atom$_{(y)}$ layer by ion-implantation. Therefore, only one reactor chamber is needed for the portion of the fabrication of the IC in which the strained-Si layer is formed.

For the ion-implantation procedure, a semiconductor layer (e.g. a Si substrate) is preferably implanted with ions of the desired heavy atoms, which become substitutional in a silicon crystalline lattice of the semiconductor layer. In other words, following a thermal treatment, the heavy ions occupy crystalline sites in the semiconductor layer. In this manner, the spacing is increased between the atoms of the crystalline structure. This increased spacing will induce a strain in the subsequently deposited amorphous Si layer after crystallization thereof or in the subsequently epitaxially grown Si layer.

The ion implantation may be performed with multiple implantation steps to generate an ion concentration gradation that decreases with depth from the surface of the semiconductor layer in order to create the larger spacing between atoms in the ion-implanted layer of the semiconductor layer after thermal treatment. However, as an additional cost reduction, the ion implantation preferably involves a single ion implantation step, resulting in a conventional bell-shape ion concentration profile, which produces the larger spacing between atoms in the implanted layer after thermal treatment.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

BRIEF DESCRIPTION OF THE DRAWINGS

FIGS. 1-3 are simplified, broken, cross-sectional views of portions of a prior art integrated circuit, which show prior art steps involved in the fabrication of the prior art integrated circuit.

FIG. 4 is a simplified, broken, cross-sectional view of a portion of an integrated circuit in which the present invention is incorporated and which has been fabricated according to the present invention.

FIGS. 5-8 are simplified, broken, cross-sectional views of portions of the integrated circuit shown in FIG. 4 showing intermediate steps involved in the fabrication of the integrated circuit.

FIG. 9 is a simplified, broken, cross-sectional view of the portion of the integrated circuit shown in FIG. 4 with a CMOS device formed thereon.

FIG. 10 is a simplified, broken, cross-sectional view of a portion of an integrated circuit in which an alternative embodiment of the present invention is incorporated and which has been fabricated according to the alternative embodiment of the present invention.

FIG. 11 is a simplified, broken, cross-sectional view of the portion of the integrated circuit shown in FIG. 10 with a CMOS device formed thereon.

DETAILED DESCRIPTION

A portion of an integrated circuit (IC) 200 which incorporates variations of a first embodiment of the present invention and which is formed by the methodology of the first embodiment of the present invention is shown in FIG. 4. The IC 200 includes a strained-Si layer 202 formed either by amorphous Si deposition or by Si epitaxial growth above a semiconductor layer 204, such as a silicon substrate. The semiconductor layer 204 generally includes an ion-implanted region (Implanted $Si_{(x)}$Heavy-Atom$_{(y)}$) 206 that extends below the surface 208 of the semiconductor layer 204. The semiconductor layer 204 may also include conventional non-implanted regions 210. A second embodiment of the present invention is described below with reference to FIGS. 10 and 11.

The amorphous Si deposition variation of the first embodiment of the present invention can be done, for example, in a low-pressure chemical vapor deposition (LPCVD) system. The LPCVD system requires the use of a CVD process chamber (not shown), which is relatively less expensive than the reactor chamber (not shown) required for epitaxial growth of strained-Si. Alternatively, the amorphous Si deposition can be done in a conventional RTCVD (Rapid Thermal CVD), evaporation or plasma process. Each of these alternatives is also generally less expensive than the epitaxial growth process.

The Si epitaxial growth variation of the first embodiment of the present invention uses the relatively expensive reactor chamber (not shown). The use of the reactor chamber may be acceptable in some circumstances, because the potential increase of the cost of the fabrication equipment is relatively moderate, the Si epitaxial growth procedure is relatively straightforward and the resulting quality of the strained-Si layer 202 is good.

The ion-implanted region 206 is formed by implanting ions, such as by ion beam implantation or plasma doping, into the region 206. The ions may be germanium ($Ge^+$) ions or antimony ($Sb^+$) ions or other "heavy" ions, which after annealing become substitutional in a Si crystalline lattice. As a result of the substitution, an increased spacing is created between atoms in the crystalline lattice of the ion-implanted region 206.

For the amorphous Si deposition variation of the first embodiment of the present invention, the strained-Si layer 202 is deposited onto the ion-implanted region 206 as amorphous Si, as described below. Upon crystallization of the amorphous Si, a strain is induced between the Si atoms of the amorphous Si due to the larger spacing between the atoms of the ion-implanted region 206, thereby forming the strained-Si layer 202. For the Si epitaxial growth variation of the first embodiment of the present invention, the strained-Si layer 202 is epitaxially grown on the ion-implanted region 206. The strain in the strained-Si layer 202 enhances the carrier mobility in the strained-Si layer 202 when incorporated with CMOS device structures, as described below.

A fabrication procedure for the portion of the IC 200 shown in FIG. 4 is described with reference to FIGS. 5-8. The ion-implanted region 206 may be either N channel or P channel silicon in the semiconductor layer 204 that is implanted with the heavy ions to initially form a region of the semiconductor layer 204 that contains atoms of the heavy ions (e.g. Atoms-in-Si Region 212), as shown in FIG. 5. To do so, a pattern is formed on the semiconductor layer 204, such as with a conventional mask 214, to expose only a desired portion 216 of the surface 218 of the semiconductor layer 204. (Alternatively, the entire surface 218 of the semiconductor layer 204 may be exposed in order to perform a "blanket" implant.) Then the desired heavy ions are implanted into the exposed portion 216 of the semiconductor layer 204.

In a preferred embodiment, the ion implantation is performed with a single implantation procedure at an appropriate dose (e.g. about $5E15/cm^2$ or higher) and energy level (e.g. about 20-60 keV) for the particular application. This procedure results in a bell-shaped ion concentration vs. depth profile within the atoms-in-Si region 212, wherein the ion concentration is at a given level at the surface 218 of the semiconductor layer 204 and increases with depth in the atoms-in-Si region 212 before decreasing and tapering off.

In another embodiment, the ion implantation is performed with multiple implantation procedures at different doses and energy levels. In this manner, a graded ion concentration profile may be created within the atoms-in-Si region 212, wherein the ion concentration is at a given level at the surface 218 of the semiconductor layer 204 and decreases with depth in the atoms-in-Si region 212 in an almost linear manner.

The mask 214 is removed, as shown in FIG. 6. Then implantation-induced crystal lattice damage is recovered in the atoms-in-Si region 212 by using heat in an anneal cycle (e.g. furnace annealing) to recrystallize the atoms-in-Si region 212 into a $Si_{(x)}Heavy-Atom_{(y)}$ crystalline region to form the ion-implanted region 206 having an increased lattice constant over that of the non-implanted regions 210. A larger spacing has been created between the atoms within the ion-implanted region 206 by the implantation and anneal. Additionally, the implantation and anneal may also result in growing a small oxide layer 220 on the surface 218 of the semiconductor layer 204, which should be removed (e.g. via a wet HF etch) as shown in FIG. 7.

For the amorphous Si deposition variation of the first embodiment of the present invention, a Si layer 222 is formed by depositing amorphous Si onto the semiconductor layer 204 in a series of conventional steps (e.g. including deposition, masking and etching steps) that leaves the (deposited amorphous) Si layer 222 preferably on only the ion-implanted region 206, as shown in FIG. 8. An anneal cycle (e.g. via furnace, laser or combination thermal treatment) may be performed to crystallize the (deposited amorphous) Si layer 222 into the strained-Si layer 202, as shown in FIG. 4.

According to this procedure, the strained-Si layer 202 is formed without a more expensive and time-consuming Si epitaxial growth process. Additionally, the strained-Si layer 202 can be made to a relatively thin depth, or thickness, (e.g. 50-300 Angstroms) with this procedure.

For the Si epitaxial growth variation of the first embodiment of the present invention, the Si layer 222 is formed by epitaxially growing Si onto the semiconductor layer 204. The Si epitaxial growth will occur only where Si is exposed, such as the ion-implanted region 206 of the semiconductor layer 204. The Si epitaxial growth will not occur on any area covered by an oxide. The Si layer 222 thus formed is essentially the strained-Si layer 202, shown in FIG. 4. Additionally, the strained-Si layer 202 can be made relatively thin (e.g. 50-300 Angstroms) with this procedure.

In a preferred embodiment, the portion of the IC 200 shown in FIG. 4 is incorporated with a CMOS device 224, such as a CMOS transistor, as shown in FIG. 9. The CMOS device 224 is formed preferably, but not necessarily, with sub-0.1 micron technology on the strained-Si layer 202. The CMOS device 224 generally includes source and drain electrode connections 226 and 228, which are formed on the strained-Si layer 202. A gate (at gate electrode connection 230) separates the source 226 and the drain 228. When the CMOS device 224 is activated during operation of the IC 200, the source 226 and the drain 228 are electrically connected by a channel 232, which extends primarily in the strained-Si layer 202 between the source 226 and the drain 228, as shown. However, the channel 232 may alternatively include portions of the ion-implanted region 206. The gate 230 is separated by and insulated from the channel 232 by a gate dielectric region or layer 234.

Since the channel 232 extends in the strained-Si layer 202, the channel 232 has enhanced carrier mobility characteristics that enables the present invention to be incorporated in IC's having structures with very small dimensions, such as the sub-0.1 micron technology devices. The enhanced carrier mobility characteristics of the channel 232 also enable the present invention to be incorporated in any CMOS technology, regardless of whether the sub-0.1 micron technology has been used in the IC's.

A portion of an integrated circuit (IC) 300 which incorporates the second embodiment of the present invention and which is formed by the methodology of the second embodiment of the present invention is shown in FIG. 10. The IC 300 includes a strained-Si layer 302 formed by amorphous Si deposition above a semiconductor layer 304, such as a silicon substrate. An epitaxially grown $Si_{(x)}Heavy-Atom_{(y)}$ layer 306 is between the semiconductor layer 304 and the strained-Si layer 302. The ions in the $Si_{(x)}Heavy-Atom_{(y)}$ layer 306 may be germanium ($Ge^+$) ions or antimony ($Sb^+$) ions or other "heavy" ions.

The $Si_{(x)}Heavy-Atom_{(y)}$ layer 306 is preferably formed with a graded ion concentration profile in an epitaxial reactor chamber. Regions of the semiconductor layer 304 where it is not desired to epitaxially grow the $Si_{(x)}ion_{(y)}$ layer 306 may be masked off if necessary. The epitaxial growth starts with a relatively low concentration of the ion at the bottom 308 of the $Si_{(x)}ion_{(y)}$ layer 306 and increases to a higher concentration of the ion at the top 310 of the $Si_{(x)}ion_{(y)}$ layer 306. As a result of the ion gradation, an increased spacing is created between atoms in the crystalline lattice of the $Si_{(x)}ion_{(y)}$ layer 306.

Amorphous Si is then deposited onto the $Si_{(x)}Heavy-Atom_{(y)}$ layer 306. The procedure for depositing the amorphous Si preferably involves conventional processing steps, such as deposition, masking and etching, that leaves the deposited amorphous Si preferably on only the $Si_{(x)}Heavy-Atom_{(y)}$ layer 306. The amorphous Si deposition can be done, for example, in an LPCVD process. Alternatively, the amorphous Si deposition can be done in a conventional RTCVD, evaporation or plasma process.

An anneal cycle (e.g. via furnace, laser or combination thermal treatment) may be performed to crystallize the deposited amorphous Si into the strained-Si layer 302. Upon crystallization, the strain is induced between the Si atoms due to the spacing of the Si atoms in the underlying $Si_{(x)}$Heavy-$Atom_{(y)}$ layer 306.

According to this procedure, the $Si_{(x)}$Heavy-$Atom_{(y)}$ layer 306, but not the strained-Si layer 302, is formed with an epitaxial growth process. In this manner, although the epitaxial growth of the $Si_{(x)}$Heavy-$Atom_{(y)}$ layer 306 may require complex control of the flow of the gases into the reactor chamber to regulate the stoichiometry of the gases, only one epitaxial growth process and one reactor chamber is required. Therefore, this procedure has a slight advantage over the procedure described in the background of having a slightly lower initial equipment cost. Additionally, the strained-Si layer 302 can be made relatively thin (e.g. 50-300 Angstroms) with this procedure.

In a preferred embodiment, the portion of the IC 300 shown in FIG. 10 is incorporated with a CMOS device 324, such as a CMOS transistor, as shown in FIG. 11. The CMOS device 324 is formed preferably, but not necessarily, with sub-0.1 micron technology on the strained-Si layer 302. The CMOS device 324 generally includes source and drain electrode connections 326 and 328 which are formed on the strained-Si layer 302. A gate (at gate electrode connection 330) separates the source and the drain electrodes 326 and 328. When the CMOS device 324 is activated during operation of the IC 300, the source and the drain electrodes 326 and 328 are electrically connected by a channel 332, which extends primarily in the strained-Si layer 302 between the source and the drain electrodes 326 and 328, as shown. However, the channel 332 may alternatively include portions of the $Si_{(x)}$Heavy-$Atom_{(y)}$ layer 306. The gate (at 330) is separated by and insulated from the channel 332 by a gate dielectric region or layer 334.

It is apparent from the previous description that the present invention permits the fabrication of strained-Si layers, as well as CMOS devices (particularly sub-0.1 micron technology devices), without the complex and costly procedures suggested in the background. In particular, the present invention reduces the epitaxial growth cost by avoiding a thick graded SiGe growth in some embodiments. Thus, the present invention requires only one epitaxial growth process or none. Though the enhancement in the carrier mobility for some variations or embodiments of the present invention may not be as great as in the prior art, the enhancement is sufficient to enable lower-cost alternatives to the prior art. For the ion-implantation embodiment, the present invention can also be tailored for selective introduction of the heavy ions into both N channel and P channel device regions with different ion doses as necessary to achieve an optimized CMOS device performance in a variety of applications. Additionally, the present invention may be used for devices built on SOI (silicon-on-insulator) or other thin film technologies. Many other advantages and improvements will be apparent after gaining a complete appreciation of the present invention.

Presently preferred embodiments of the present invention and many of its improvements have been described with a degree of particularity. This description is of preferred examples of implementing the invention, and is not necessarily intended to limit the scope of the invention. The scope of the invention is defined by the following claims.

The invention claimed is:

1. A method of forming a portion of an integrated circuit comprising:
   providing a semiconductor layer;
   implanting heavy ions into at least a portion of the semiconductor layer not previously containing the heavy ions;
   recrystallizing the ion-implanted portion of the semiconductor layer;
   depositing amorphous silicon onto the ion-implanted portion of the semiconductor layer; and
   forming a strained-silicon layer in the deposited amorphous silicon, the strain being induced by the recrystallized ion-implanted portion of the semiconductor layer.

2. A method as defined in claim 1 further comprising:
   forming a CMOS device on the strained-silicon layer, the CMOS device having a channel region formed in the strained-silicon layer.

3. A method of forming an integrated circuit comprising:
   providing a semiconductor layer;
   forming a region of the semiconductor layer having desired ions therein by implanting the desired ions into the region of the semiconductor layer;
   depositing an amorphous silicon layer on the region of the semiconductor substrate having the desired ions therein;
   forming a CMOS device above the amorphous silicon layer.

4. A method as defined in claim 3 further comprising:
   providing the semiconductor layer having a crystalline lattice; and
   the step of forming the region of the semiconductor layer having the desired ions therein further comprising:
   forming the desired ions in substitutional positions in the crystalline lattice of the semiconductor layer by implanting the desired ions into the region of the semiconductor layer and recrystallizing the region of the semiconductor layer by annealing the crystalline lattice.

5. A method as defined in claim 4 further comprising:
   generating a larger spacing between atoms of the crystalline lattice of the region of the semiconductor layer having the desired ions therein by the step of forming the desired ions in substitutional positions in the crystalline lattice.

6. A method as defined in claim 5 further comprising:
   upon depositing the amorphous silicon layer, converting the amorphous silicon layer into a strained-silicon layer.

7. A method as defined in claim 3 further comprising:
   forming a graded ion concentration in the region of the semiconductor layer having desired ions therein by implanting the desired ions using a single ion implantation step.

8. A method as defined in claim 3 further comprising:
   forming a graded ion concentration in the region of the semiconductor layer having desired ions therein by implanting the desired ions using multiple ion implantations.

9. A method as defined in claim 3 further comprising:
   depositing the amorphous silicon layer to a thickness of about 50-300 Angstroms.

10. A method as defined in claim 3 wherein:
    the step of forming the region of the semiconductor layer having the desired ions therein further comprises:
    implanting heavy ions into the region of the semiconductor layer.

11. A method as defined in claim 10 wherein:
    the step of implanting the heavy ions further comprises:
    implanting germanium ions into the region of the semiconductor layer.

12. A method as defined in claim 10 wherein:
the step of implanting the heavy ions further comprises: implanting antimony ions into the region of the semiconductor layer.

13. A method of forming a portion of an integrated circuit comprising:
providing a semiconductor layer;
epitaxially growing a silicon-ion layer onto the portion of the semiconductor layer;
depositing amorphous silicon onto the silicon-ion layer; and
forming a strained-silicon layer in the deposited amorphous silicon, the strain being induced by the epitaxially grown silicon-ion layer.

14. An integrated circuit comprising:
a semiconductor layer;
a layer of one of: (a) an ion-implanted region formed in the semiconductor layer, and (b) an epitaxially grown silicon-ion formed on the semiconductor layer;
a strained-silicon layer formed by one of: (c) amorphous silicon deposition on the ion-implanted region of the semiconductor layer, and (d) amorphous silicon deposition on the epitaxially grown silicon-ion layer; and
a CMOS device formed on the strained-silicon layer.

15. An integrated circuit as defined in claim 14 wherein the strained-silicon layer is formed to a thickness of about 50-300 Angstroms.

16. An integrated circuit as defined in claim 14 wherein:
the semiconductor layer has a crystalline lattice; and
for the ion-implanted region of the semiconductor layer desired ions increase spacing between atoms of the crystalline lattice.

17. An integrated circuit as defined in claim 14 wherein:
for the ion-implanted region: a graded ion concentration of desired ions is formed in the ion-implanted region by implanting the desired ions into the semiconductor layer using a single ion implantation step.

18. An integrated circuit as defined in claim 14 wherein:
for the ion-implanted region: a graded ion concentration of desired ions is formed in the ion-implanted region by implanting the desired ions into the semiconductor layer using multiple ion implantations.

19. An integrated circuit as defined in claim 14 wherein the ion-implanted region and the epitaxially grown silicon-ion layer include heavy ions therein.

20. An integrated circuit as defined in claim 19 wherein the heavy ions include germanium ions.

21. An integrated circuit as defined in claim 19 wherein the heavy ions include antimony ions.

* * * * *